United States Patent
Watanabe

[11] Patent Number: 5,856,053
[45] Date of Patent: Jan. 5, 1999

[54] METHOD FOR ESTIMATING OPTIMUM POSITION OF A WAFER FOR FORMING IMAGE PATTERNS THEREON

[75] Inventor: Akira Watanabe, Tokyo, Japan

[73] Assignee: Oki Electric Industry Co., Ltd., Tokyo, Japan

[21] Appl. No.: 759,720

[22] Filed: Dec. 6, 1996

Related U.S. Application Data

[63] Continuation-in-part of Ser. No. 446,719, filed as PCT/JP94/01705, Oct. 12, 1994, abandoned.

[30] Foreign Application Priority Data

Oct. 13, 1993 [JP] Japan .................................. 5-256003

[51] Int. Cl.⁶ ...................................................... G03F 9/00
[52] U.S. Cl. .............................................................. 430/22
[58] Field of Search ..................... 430/5, 22; 250/492.2; 355/52

[56] References Cited

U.S. PATENT DOCUMENTS

| | | | |
|---|---|---|---|
| 5,087,537 | 2/1992 | Conway et al. | 430/22 |
| 5,298,365 | 3/1994 | Okamoto et al. | 430/5 |
| 5,447,810 | 9/1995 | Chen et al. | 430/5 |

*Primary Examiner*—S. Rosasco
*Attorney, Agent, or Firm*—Spencer & Frank

[57] ABSTRACT

Apparatus for determining the optimum position of an object with respect to a focal point of a focused beam of radiation. The apparatus has a resolution limit and includes a radiation source, a lens for focusing the beam of radiation on the object, and a reticle interposed between the radiation source and the lens. A focusing pattern, formed on the reticle, when projected onto the object by the focusing means, produces a projected focusing pattern which is not resolvable, the resolution of the projected focusing pattern being not greater than the resolution limit of the apparatus.

11 Claims, 14 Drawing Sheets

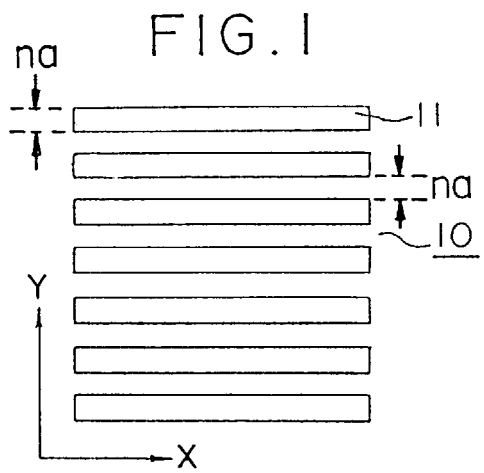
FIG. 1
FIRST RETICLE PATTERN FOR FOCUS ESTIMATION OF THE INVENTION
FIG. 2(a)
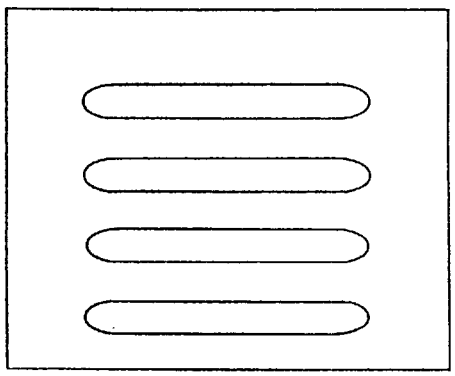
a = 0.35μm
FIG. 2(b)
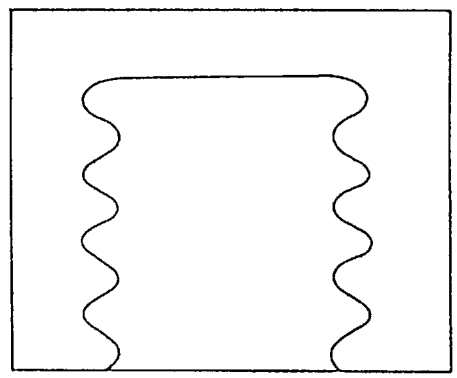
a = 0.30μm
FIG. 2(c)
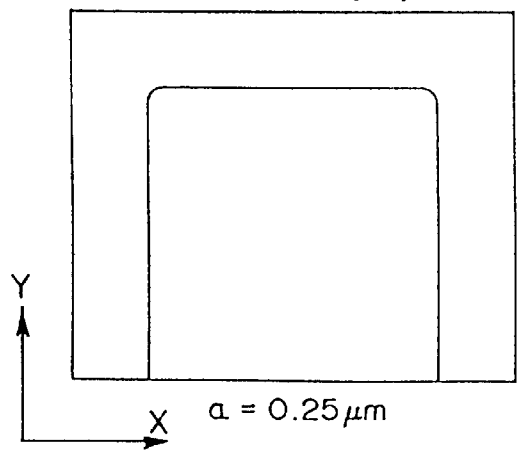
a = 0.25μm
FIG. 2(d)
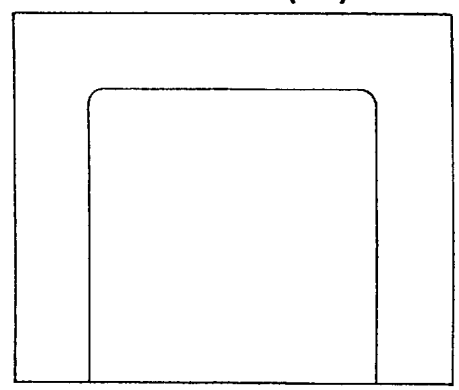
a = 0.20μm
TRANSFERRED PATTERNS OF RETICLE PATTERN IN FIG. 1

DIAGRAM ILLUSTRATING A RELATION BETWEEN WAFER POSITION IN THE Z-AXIS DIRECTION AND SIZE OF TRANSFERRED PATTERN IN THE X-AXIS DIRECTION

SECOND RETICLE PATTERN FOR FOCUS
ESTIMATION OF THE INVENTION a = 0.35 μm a = 0.30 μm a = 0.25 μm a = 0.20 μm

TRANSFERRED PATTERNS OF RETICLE PATTERN IN FIG. 5

THIRD RETICLE PATTERN FOR FOCUS
ESTIMATION OF THE INVENTION

FOURTH RETICLE PATTERN FOR FOCUS ESTIMATION
OF THE INVENTION

FIFTH RETICLE PATTERN FOR FOCUS ESTIMATION
OF THE INVENTION

STEPPER APPARATUS

METHOD FOR ESTIMATING OPTIMUM POSITION OF A WAFER FOR FORMING IMAGE PATTERNS THEREON

CROSS-REFERENCE TO RELATED APPLICATION

This application is a continuation-in-part of application Ser. No. 08/446,719, filed as PCT/JP94/01705, Oct. 12, 1994, now abandoned.

BACKGROUND OF THE INVENTION

1. Field of the Invention

This invention relates to a pattern for determining the optimum position of an object with respect to the focal point of a beam of radiation focused on the object. In particular, it relates to a reticle pattern formed on a reticle for determining the optimum position of a wafer with respect to the focal point of a beam of light which projects an image on the surface of the wafer as part of a semiconductor manufacturing process. Moreover, it relates to a method for estimating the optimum position of a wafer or other object with respect to the focal point of a beam of light by the use of a reticle pattern formed on a reticle.

2. Description of the Related Art

A conventional reduction projection exposure method for forming high resolution image patterns on a wafer by the use of a mask is described in "VLSI Technology Guide [Nyumon]" (Heibonshia), p. 143–144. An advantage of this method is that the mask is not damaged during the exposure process because the mask and wafer do not come into contact with each other thereby ensuring that the mask remains free of defects that might result from such contact. Another advantage of the process is that it results in a relatively high yield of the semiconductor product being manufactured. Apparatuses used for the reduction projection exposure method are referred to as steppers, an example of a conventional stepper being shown in FIG. 17.

In FIG. 17, a mercury vapor lamp 171 provides a source of light that is passed through a condenser lens 172 and a filter (not shown) along a vertical Z-axis to provide a beam of substantially single frequency light. The filtered light beam impinges on a reticle 173 having deposited thereon an original of an image pattern consisting of opaque and transparent areas, the letter "A" being shown in FIG. 17 as an example. The light passes through the transparent portions of the image pattern and is focused, after passing through a reduction lens 174, onto the surface of a wafer 175 covered with a photoresist material. The light is automatically focused on the wafer, which is mounted on a stage 176 movable along X, Y and Z axes, under predetermined exposure conditions by means of a sensor (not shown) located near the light source. The sensor detects the relative position of the photoresist covered surface of the wafer with respect to the focal point of the focused light. Means (not shown) are provided for changing the relative positions of the wafer and the focal point of the focused light along the Z-axis.

A disadvantage of this system in that the relative position of the wafer along the Z-axis, as set by the sensor, and the focal point at which the optical system brings the light into focus are not always matched. Consequently, any deviation in the position of the wafer surface from the optimum position must be measured and corrected.

SUMMARY OF THE INVENTION

An object of the invention is to provide a reticle pattern for measuring any deviation between the position of an object and the focal point at which an optical system brings a beam of radiation into focus.

Another object of the invention is to provide a method in which a reticle pattern is used to determine the optimum location of an object such as a semiconductor wafer with respect to a point at which an optical system brings a beam of radiation into focus.

More specifically, the invention can be used with a stepper apparatus for determining the optimum position of a semiconductor wafer, having a photoresist material on the surface thereof, with respect to the focal point of a focused beam of light. The stepper apparatus has a resolution limit and includes a radiation source for producing a beam of light, means for focusing the beam of light on the surface of the wafer, and a reticle interposed between the radiation source and the focusing means.

In one embodiment, a reticle pattern is formed on the reticle. The reticle pattern comprises a plurality of spaced parallel lines or elements of equal width, the spacing between each of the parallel lines being equal to the width of the lines or elements. The focusing pattern, when projected onto an object such as a semiconductor wafer by the focusing means, produces a transferred reticle pattern which is not resolvable because the resolution of the transferred reticle pattern is not greater than the resolution limit of the apparatus.

In another embodiment, an image pattern and a reticle pattern are formed on the reticle. The image pattern when projected onto a semiconductor wafer forms a projected image pattern on the wafer which is resolvable because the resolution of the projected image pattern is greater than the resolution limit of the apparatus. As in the first described embodiment, the reticle pattern comprises a plurality of spaced parallel lines or elements of equal width, the spacing between each of the parallel lines being equal to the width of the lines.

In still another embodiment of the invention, an image pattern and a reticle pattern are formed adjacent to each other on the reticle. The image pattern when projected onto a semiconductor wafer forms a projected image pattern on the wafer which is resolvable because the resolution of the projected image pattern is greater than the resolution limit of the apparatus. The reticle pattern comprises a rectangular area having parallel spaced sides, opposite spaced sides of the rectangular area having triangular serrate portions wherein each of said triangular portions has a base which is twice its height.

In a further embodiment of the invention the reticle pattern formed adjacent the image pattern on the reticle comprises a rectangular area having parallel spaced sides, each of the sides of the rectangular area having plural rectangular comb-tooth shaped portions wherein alternate first elements of the comb-tooth shaped portions have a first width. The comb-tooth shaped portions also have second elements, located between each of the first elements, which have a second width that is greater than the first width.

The invention also includes a method of determining the optimum position of a semiconductor wafer with respect to a focal point of a radiation beam comprising the steps of preparing a reticle having a reticle pattern thereon as described above; transferring the reticle pattern onto a semiconductor wafer a plurality of times at different distances of the wafer from the focal point of the beam; determining the position of the wafer with respect to the focal point at each of the distances; and setting the wafer at the position which provides the best focus of the reticle pattern on the wafer.

BRIEF DESCRIPTION OF THE DRAWINGS

FIG. 1 is a diagram illustrating a first reticle pattern formed on a reticle for determining, in a stepper apparatus, the optimum position of the surface of a semiconductor wafer onto which an image pattern is to be projected;

FIGS. 2(a) to 2(d) are diagrams illustrating transferred reticle patterns transferred onto the surface of the semiconductor wafer which correspond to the first reticle pattern of FIG. 1 for different line widths and line spacings;

DESCRIPTION OF THE PREFERRED EMBODIMENTS

The following is a description of the first embodiment of the invention.

Figure 17:
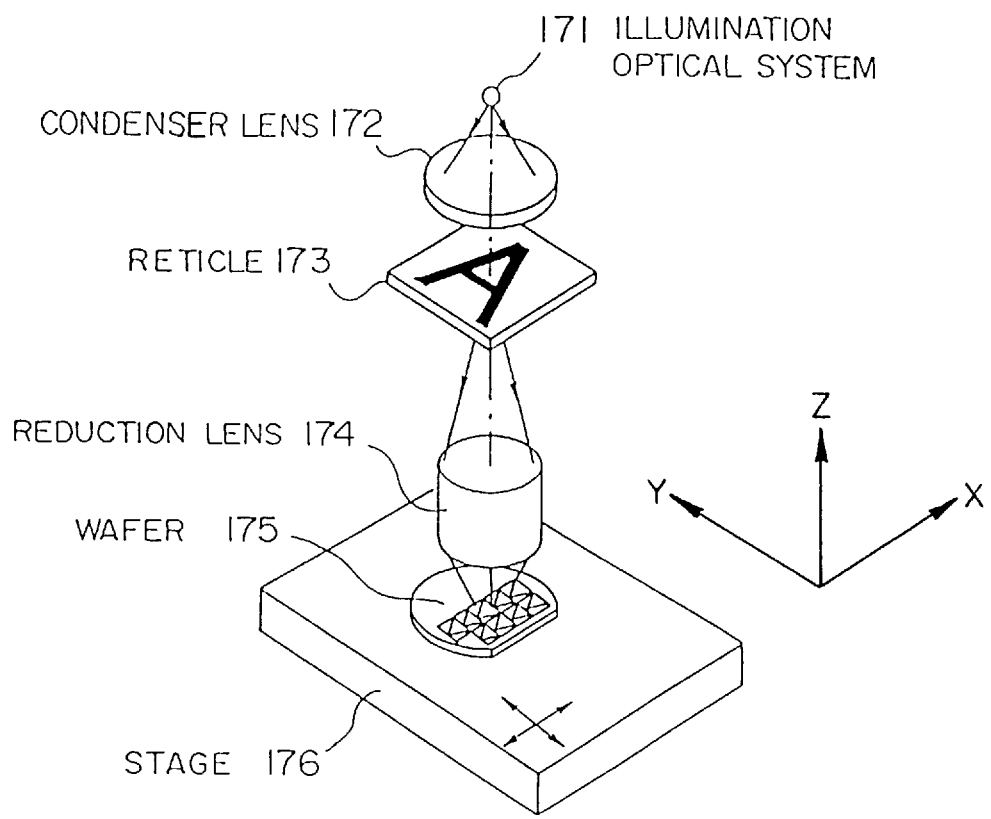
FIG. 17 is a diagram illustrating a conventional stepper apparatus.

FIG. 1 is a diagram illustrating a first reticle pattern 10 suitable for forming on the reticle 173 of the stepper apparatus shown in FIG. 17. The reticle pattern 10, which may be formed on the reticle 173 adjacent to an image pattern such as the letter "A" in FIG. 17, consists of a series of parallel opaque lines or elements 11 extending along the indicated X-axis. Each of the lines has a width na in the direction of the Y-axis, and adjacent lines are separated from each other by transparent spaces also having widths equal to na, where n is the reduction ratio of the reduction lens 174 and a is equal to or less than the resolution limit R of the stepper.

The reduction ratio is defined as the ratio of the area of the light beam impinging on the reduction lens 174 to the area of the light beam impinging on the surface of the wafer 175 after passing through the reduction lens. The resolution limit R of the stepper is given by the equation R=k$\lambda$/N.A., where k is a constant, $\lambda$ is the frequency of the light impinging on the reticle 173, and N.A. is the numerical aperture of the reduction lens. In a typical example, k=N.A.=0.5 and $\lambda$=0.365 $\mu$m, and therefore R=0.365 $\mu$m. For the reticle pattern of FIG. 1, the value of a is equal to or less than 0.365 $\mu$m.

FIG. 2(a) shows the pattern transferred to a photoresist material deposited on the surface of the wafer 175 by the reticle pattern of FIG. 1 when the value of a is 0.35 $\mu$m. Although the ends of the transferred pattern are rounded, the respective transferred elements are separated. FIG. 2(b) shows the reticle pattern transferred to the photoresist material when the value of a is 0.30 $\mu$m. The respective elements are separated, and the ends of the transferred pattern are corrugated. FIGS. 2(c) and 2(d) show the reticle patterns transferred to the photoresist on the surface of the wafer 175 for values of a equal to 0.25 $\mu$m and 0.20 $\mu$m, respectively. The respective transferred patterns for the examples of FIGS. 2(c) and 2(d) are not separated, the transferred patterns being formed in the shapes of a large squares.

In FIGS. 2(a) to 2(d), the value of a for the patterns transferred onto the surface of the wafer are numerical values equal to or less than the resolution limit R. If the reduction lens 174 provides a ⅕ reduction, n has a value of five, and the width of each line of FIG. 1 and the spacing between each line is equal to 5a. A typical exposure period for the examples given in FIGS. 2(a) to 2(d) is 160 msec.

The patterns projected on the surface of the wafer are not precisely separated (not resolvable) when the value of a is equal to or less than the resolution limit. In particular, when a is equal to 0.25 $\mu$m for a resolution limit R of 0.365 $\mu$m, and the widths of the lines 11 and the spaces between the lines 11 of FIG. 1 are 1.25 μm, the pattern projected on the surface of the wafer has the appearance of a large square, as shown in FIG. 2(c).

A method of estimating the optimum position for the surface of the wafer 175 with respect to the focal point of the light beam is described below with reference to FIGS. 1, 2(c), 3, 4 and 17.

As a first step, the reticle pattern shown in FIG. 1 is deposited as a thin film on the reticle 173. This pattern has dimensions which provide a value of a equal to 0.25 μm and therefore, assuming a value of n equal to 5, the width of the lines 11 and of the spaces between these lines is selected to be 1.25 μm. As, shown in FIG. 2(c), when this focusing pattern is employed, the form of the transferred pattern becomes a large rectangle having a size which is easily measured.

The reticle pattern of FIG. 1 is transferred (exposed and developed) onto one or more portions of the photoresist material deposited on the surface of the wafer 175. In this step of the process, the exposure amount is maintained constant and the exposure time set at 160 msec.

Figure 3:
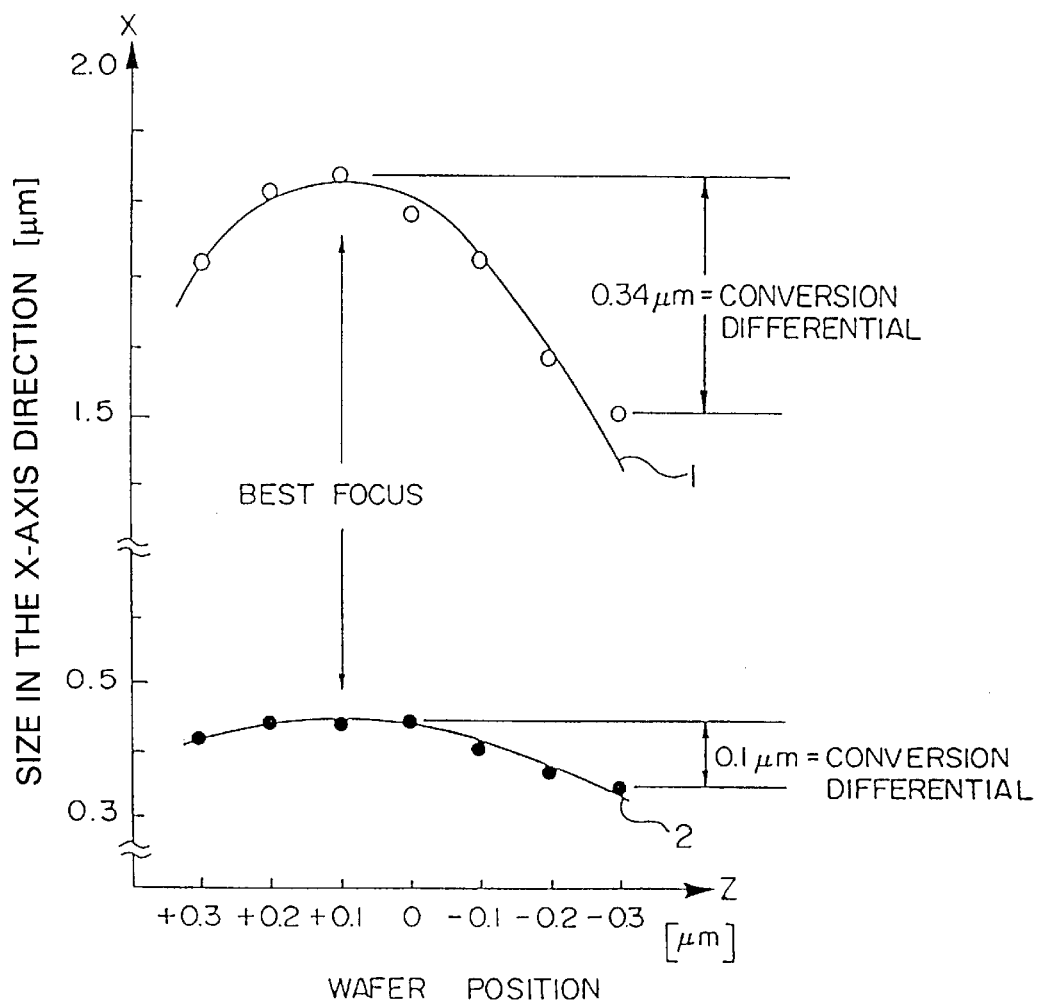
FIG. 3 is a diagram showing the relationship between the position of the surface of the wafer along the Z-axis of the stepper apparatus and the size of the pattern transferred onto the wafer for different line widths and line spacings of the first reticle pattern of FIG. 1.

Referring now to FIG. 3, the wafer 175 is displaced along the Z-axis (see FIG. 17) from a reference position ("0" on the abscissa of FIG. 3 set by the sensor of the stepping apparatus) by increments and/or decrements of 0.1, 0.2 and 0.3 μm upward (+) and by 0.1, 0.2, and 0.3 μm downward (–). The size of the pattern transferred on to the surface of the wafer is measured by optical size measuring equipment along the X-axis for each of the incremental and decremental positions and is then plotted on the ordinate of FIG. 3.

Graph 1 of FIG. 3 plots the relation between the size of the transferred pattern shown in FIG. 2(c), measured along the X-axis, and the wafer position along the Z-axis for a equal to 0.25 μm, a value of a which is below the resolution limit R of 0.365 μm. The maximum value $X_{max}$ of Graph 1 is obtained in this example for a measurement along the X-axis in FIG. 2(c) of approximately 1.84 μm at a displacement of the wafer along the Z-axis of +0.1 μm from the reference position "0" set by the sensor. The +0.1 μm displacement of the wafer corresponds to the position at which the transferred pattern comes into focus. That is, in this case, the position at which the pattern comes into focus is shifted 0.1 μm to the left of the reference position "0" set by the sensor.

Thus, under constant exposure conditions, the optimum focus position can be judged from a diagram correlating the wafer position and the size of the transferred pattern along the X-axis. Consideration of such a diagram permits the image pattern to be formed more accurately by correcting the position set by the sensor as a function of any deviations between the optimum focus position and the position set by the sensor.

Graph 2 shows the relation between the wafer position along the Z-axis and the size of the transferred pattern along the X-axis when the value of a is 0.5 μm, that is, greater than the resolution limit R of 0.365 μm. In this case, the width of the lines 11 in FIG. 1 and the spaces therebetween are equal to 2.5 μm, that is, 5 times 0.5 μm. Where the pattern width and pattern interval are 0.5 μm, the transferred line patterns are separated and distinct from each other (that is, resolvable), and the shape of the transferred pattern is neither rectangular nor square as measured by a scanning electron microscope (SEM) type size measuring equipment. The reason the SEM size measuring equipment was used is that a very fine line width on the order of 0.5 μm cannot be measured by optical size measuring equipment. Details of the SEM equipment are described hereinafter in connection with a third embodiment of the invention.

Referring again to Graph 1 where a is below the resolution limit R of 0.365 μm, the wafer position at which the transferred pattern comes into focus (the optimum focus position) is at +0.1 μm. The deviation (conversion differential) between the size measured along the X-axis when the wafer position along the Z-axis is at –0.3 μm and the size in the X-axis direction at the point of inflection (where the wafer position is at +0.1 μm) is about 0.34 μm. In contrast, with reference to Graph 2 where a is greater than the resolution limit R, the conversion differential is only about 0.1 μm. This shows that the method for estimating focus of the invention has a sensitivity which is at least three times as great when a=0.25 μm than when it is 0.5 μm, and the image pattern can be accurately formed by finely adjusting the wafer position.

Figure 4:
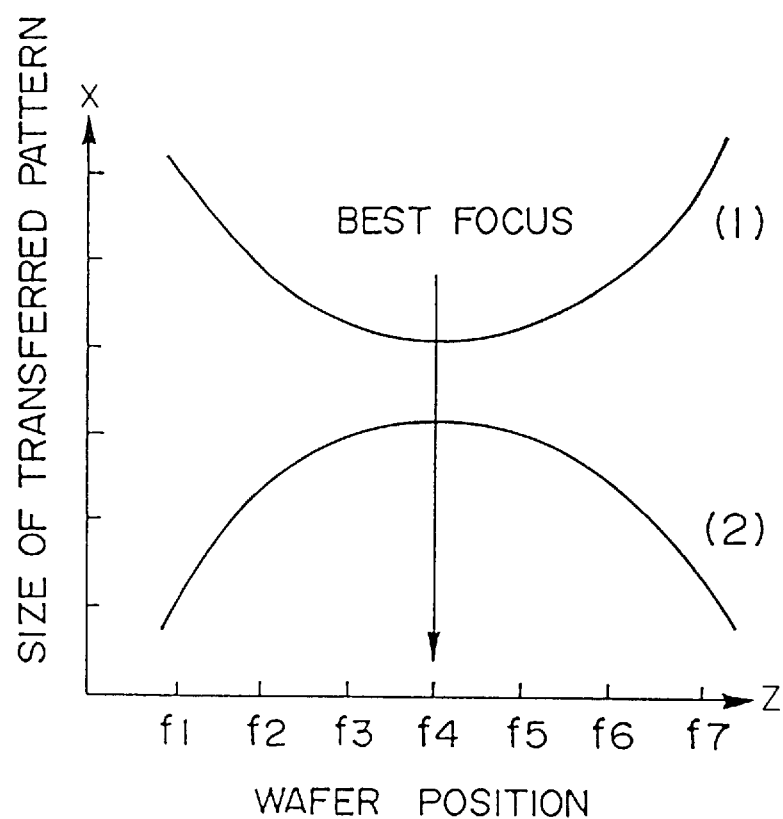
FIG. 4 is a diagram schematically showing a relation between wafer position along the Z-axis and transferred pattern size in the X-axis direction for the first reticle pattern of FIG. 1.

In FIG. 3, the widths of the transferred patterns are reduced in size as the position of the wafer is moved along the Z-axis away from the optimum position of +0.1 μm. Accordingly, both Graphs 1 and 2 have convex shapes. However, if the amount of exposure is increased or the period of exposure is lengthened, the width of the transferred pattern is increased as the position of the wafer is moved away from the optimum position along the Z-axis and a curve having a concave shape may be obtained. In FIG. 4, a Graph 2 having a convex shape and a Graph 1 having a concave shape are schematically shown. In the case of Graph 1, the minimum value indicates the best focus position.

Where there are many points of inflection in a graph, the amount of exposure is relatively large and/or the exposure period is relatively long. The maximum value of the graph indicates the optimum wafer position at which the pattern comes into focus. Where they are few points of inflection, the amount of exposure is relatively small and/or the exposure period is relatively short. The minimum value of the graph indicates the optimum wafer position at which the pattern comes into focus.

Figure 5:
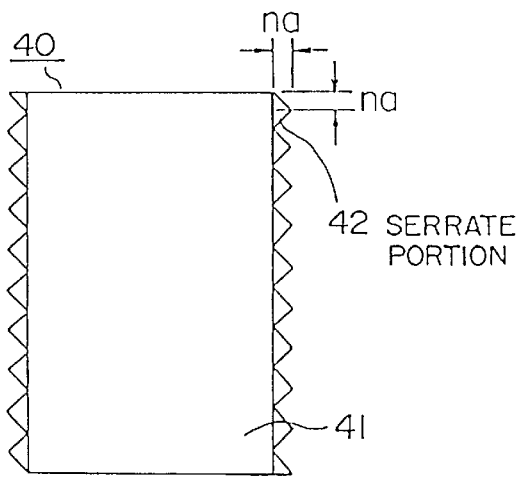
FIG. 5 is a diagram illustrating a second reticle pattern formed on a reticle for determining the optimum position of the surface of a semiconductor wafer onto which an image pattern is to be projected.

The following is a description of the second embodiment of the invention:

FIG. 5 shows a second reticle pattern 40 for determining the optimum position of the surface of the wafer relative to the focal point of the focused light beam. In this pattern, plural triangular serrate portions 42 are formed around a rectangular portion 41. The shape of the rectangular portion is not critical. The triangular serrate portion 42 consists of a plurality of right-angle isosceles triangles each having a base equal to 2na μm and a height of na μm.

Figure 6A:
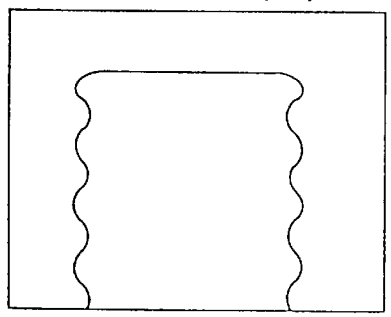
FIGS. 6(a) to 6(d) are diagrams illustrating transferred reticle patterns transferred onto the surface of the semiconductor wafer which correspond to the second reticle pattern of FIG. 5 for different pattern dimensions.
Figure 6B:
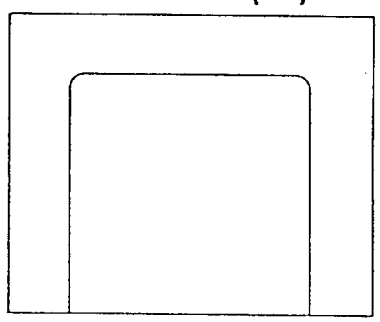
Figure 6C:
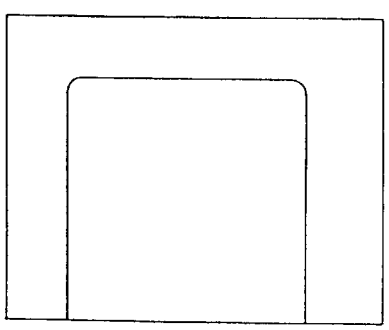
Figure 6D:
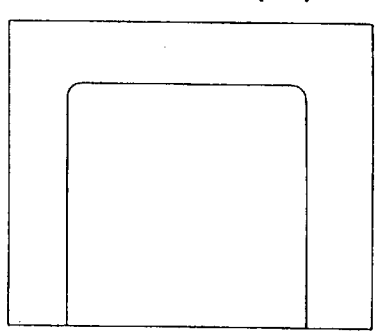

FIGS. 6(a) to 6(d) illustrate the patterns obtained on the surface of the wafer when the reticle pattern of FIG. 5 is transferred thereto. FIG. 6(a) shows the transferred pattern when the value of a is 0.35 μm. In this case, the ends of the transferred pattern are serrated. FIGS. 6(b), 6(c) and 6(d) show the transferred patterns when a is 0.30 μm, 0.25 μm and 0.20 μm respectively and the transferred patterns are almost square. As in the case of FIGS. 1 and 2(a) to 2(d), the value of a is a numerical value corresponding to the pattern transferred onto the surface of the wafer. The heights of the triangular portions 42 of the reticle pattern on the reticle, illustrated in FIG. 5, have a value 5a when the reduction provided by the reduction lens 174 is equal to five, and the bases of the triangular portions have a value 10a. The examples shown in FIGS. 6(a) to 6(d) were obtained with an exposure period of 160 msec.

Thus, with the reticle pattern shown in FIG. 5 and a value of a equal to or less than the resolution limit R, the transferred pattern is not resolvable. More specifically, with a value of a equal to 0.30 μm or less, the transferred pattern is approximately in the shape of a square.

For example, if the reticle pattern in FIG. 5 in which a=0.30 μm is transferred to the surface of the wafer, and the position of the wafer varied along the Z-axis as in the first embodiment and the size of the transferred pattern along the X-axis are measured, a graph similar to Graph 1 of FIG. 3 in which the conversion differential is relatively large would be obtained.

By use of the reticle pattern of FIG. 5, a relatively large conversion differential is obtained and the optimum focus position of the wafer easily determined. Thus, from a determination of the optimum focus position, the transferred image pattern can be accurately formed by finely adjusting the wafer position.

Figure 7A:
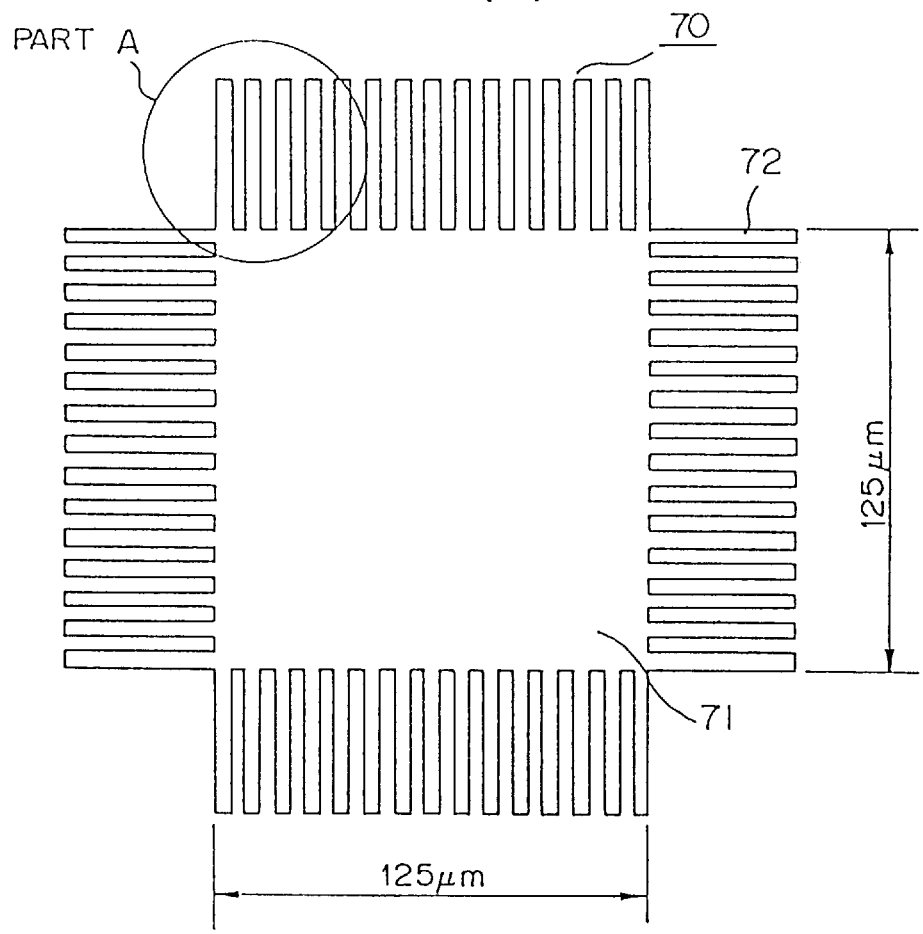
FIGS. 7a and 7b are diagrams illustrating a third reticle pattern formed on a reticle for determining the optimum position of the surface of a semiconductor wafer onto which an image pattern is to be projected.

The following is a description of the third embodiment of the invention:

FIG. 7(a) shows a third reticle pattern 70 for determining the optimum position of the surface of the wafer relative to the focal point of the focused light beam. In FIG. 7(a), plural rectangular comb-tooth portions 72 are formed around a rectangular portion 71 which may, for example, be a square 125 μm on each side. The shape of the rectangular portion 71 is not critical, and portion 71 can be a square having sides equal to between 50 and 200 μm.

Figure 7B:
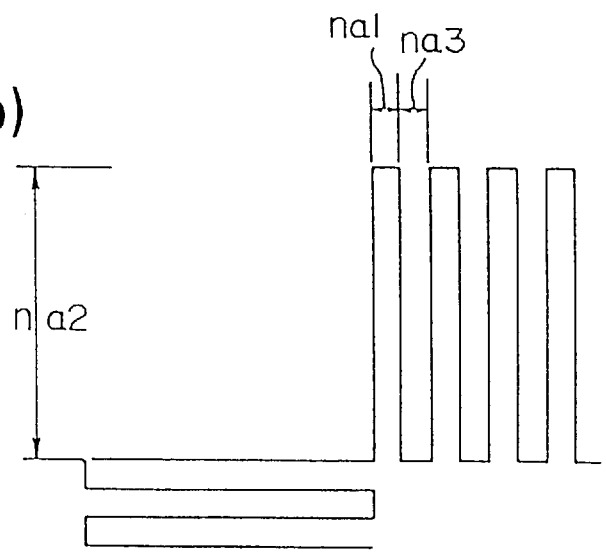
Figure 8:
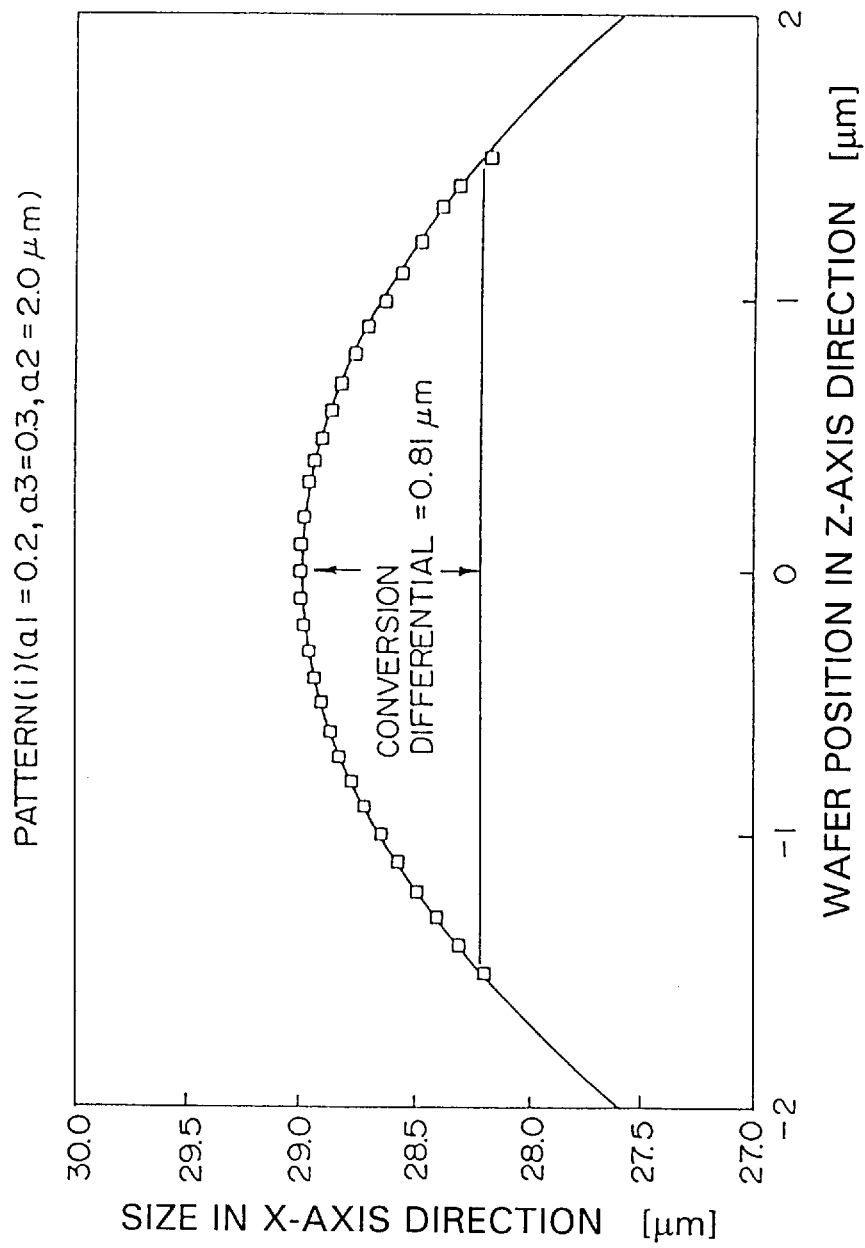
FIG. 8 is a diagram showing a relation between the size of the transferred pattern along the X-axis and the wafer position along the Z-axis when the third reticle pattern of FIGS. 7(a) and 7(b) is used, and wherein the projected dimensions a1, a2 and a3 are 0.2 $\mu$m, 2.0 $\mu$m and 0.3 $\mu$m respectively.

FIG. 7(b) depicts Part A of FIG. 7(a) on a larger scale. As shown, the rectangular comb-tooth portion 72 comprises a plurality of rectangles each having a width na1 and a length na2 separated from each other by a space na3, where, by way of example, the reduction ratio n is assumed to be equal to five. A method for estimating focus by use of the reticle pattern shown in FIGS. 7(a) and 7(b) is as follows:

(i) Assuming that a1=0.2 μm, a2=2.0 μm and a3=0.3 μm as indicated in FIG. 8, the reticle pattern of FIG. 7(a) (in which na1=1.0 μm, na2=10.0 μm and na3=1.5 μm) is prepared. Next, this pattern is transferred (exposed and developed) onto the wafer 175 by varying the position of the wafer along the Z-axis so that the pattern is projected on to a plurality of subdivided areas of the wafer on which photoresist has previously been coated. The amount of exposure and the time during which the photoresist is exposed is kept constant, and the pattern projected on the wafer by the reduction lens 174 reduced by a factor of 5 so that n=5.

In preparing FIG. 8, the position of the semiconductor wafer 175 was varied along the Z-axis from +1.5 μm to −1.5 μm with the wafer position set by the sensor being designated as the reference position, 0 μm. Next, the size of the pattern transferred onto the wafer was measured along the X-axis by optical size measuring equipment.

Optical size measuring equipment is used for this measurement because it has the advantage of being less expensive than the SEM type measuring equipment described in connection with the first embodiment, is a general purpose instrument, allows measurements to be made in a relatively short time and is fully automatic. However, optical size measuring equipment has a lower resolution power than SEM equipment. That is, the optical size measurement equipment cannot measure a very fine pattern width around 0.5 μm, as discussed in connection with the first embodiment of the invention.

The relation between the size of the transferred pattern along the X-axis and the wafer position along the Z-axis is shown in FIG. 8. In this case, the wafer position at which the pattern comes into focus (the best focus position) is at 0 μm.

The deviation (the conversion differential) between the size along the X-axis when the wafer is at ±1.5 μm and the maximum value (in this case, the size along the X-axis when the wafer position is at 0 μm=29.0 μm) is about 0.81 μm.

Figure 14:
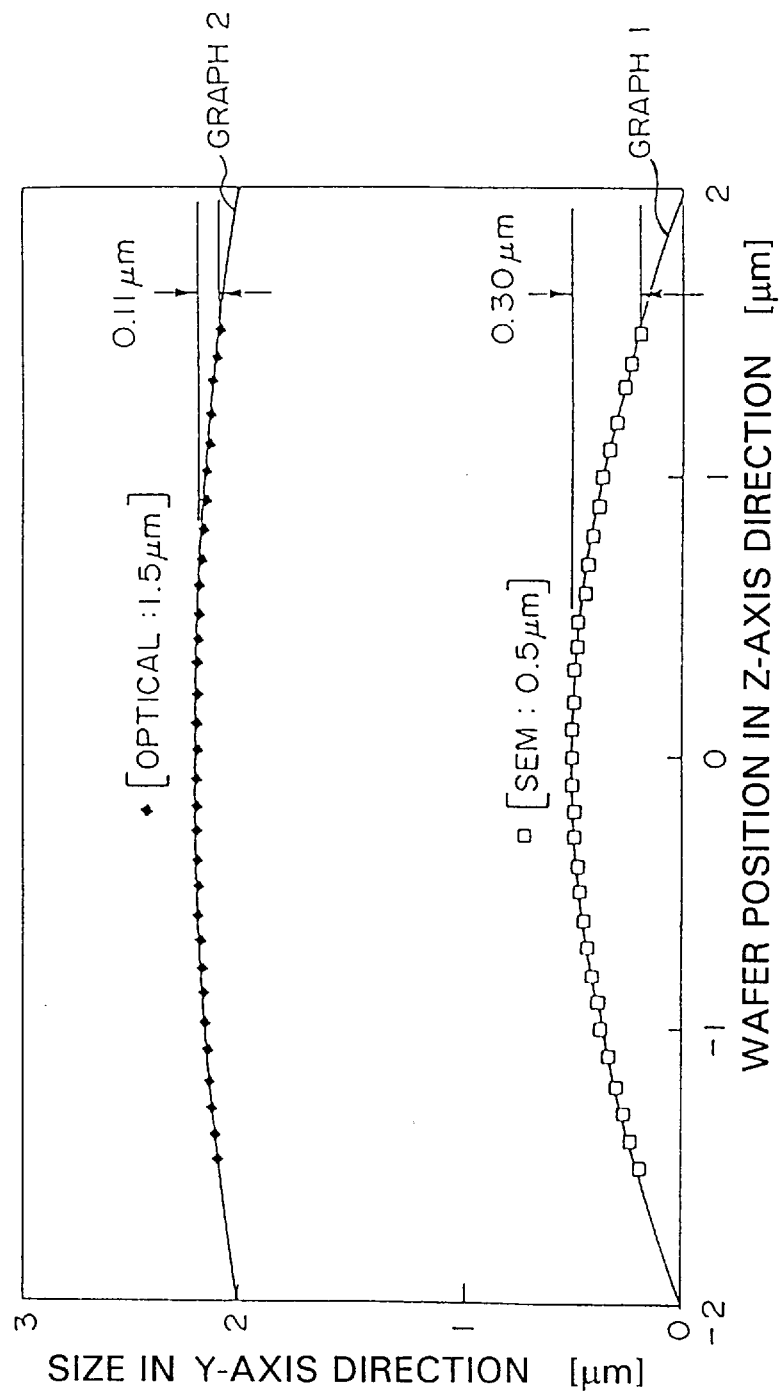
FIG. 14 is a diagram showing comparative data.

FIG. 14 provides data comparing the results obtained when optical type size measuring equipment and SEM type size measuring equipment are used. Graph 1 of FIG. 14 shows how the size of the transferred pattern changes along the Y-axis when the wafer is moved along the Z-axis, the projected reticle pattern has a width and pattern interval on the wafer 175 of 0.5 μm, and measurements are made by an SEM type size measuring equipment. In this case, the deviation (the conversion differential) between the size along the Y-axis when the wafer position is at −1.5 μm and the maximum value (in this case, the size along the X-axis when the wafer position is at 0 μm=29.0 μm) is about 0.30 μm. The reason the conversion differential (0.30 μm) is larger than in the case of Graph 2 of FIG. 3 (where the conversion differential=0.1 μm) is that the wafer position is changed along the Z-axis by a larger amount (from +1.5 μm to −1.5 μm). Thus, where na1, na2 and na3 of the reticle pattern of FIGS. 7(a) and 7(b) are set to 1.0 μm, 10.0 μm and 1.5 μm respectively, the conversion differential is 0.81/0.3= 2.7 times that obtained when a line pattern having a pattern width and pattern interval of 0.5 μm is employed (the conversion differential being about 0.30 μm). This pattern allows the pattern size to be measured easily and in a short time because it is measurable by the optical size measuring equipment.

For reference, Graph 2 of FIG. 14 shows the result of measuring the projected size of the line pattern by the use of optical size measuring equipment. The optical size measuring equipment cannot measure the pattern size of the transferred pattern unless a line pattern having a projected pattern width and pattern interval of about 1.5 μm is employed because this equipment has low resolution power. In this case, as shown by Graph 2, the conversion differential is about 0.11 μm, which is one-third that obtained in the case of Graph 1. Accordingly, where a measurement is conducted by optical size measuring equipment, a sensitivity eight times that obtained when the line pattern having a transferred pattern width and pattern interval of about 1.5 μm is employed if the reticle pattern around which the comb-tooth portions are formed have dimensions equal to or less than the resolution limit, as shown in FIGS. 7(a) and 7(b).

Figure 9:
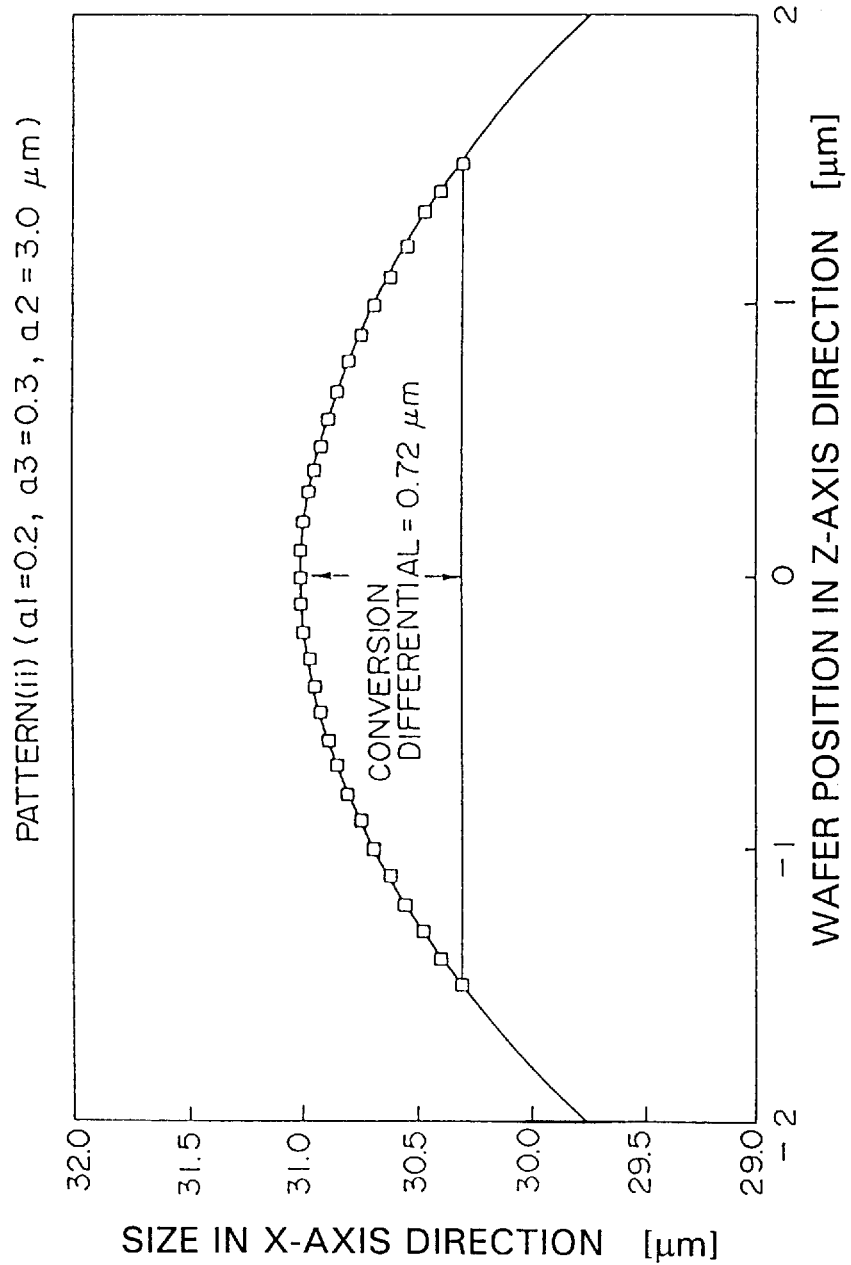
FIG. 9 is a diagram showing a relation between the size of the transferred pattern along the X-axis and the wafer position along the Z-axis when the third reticle pattern of FIGS. 7(a) and 7(b) is used, and wherein the projected dimensions a1, a2 and a3 are 0.2 $\mu$m, 3.0 $\mu$m and 0.3 $\mu$m respectively.

(ii) If the reticle pattern shown in FIGS. 7(a) and 7(b), where na1=1.0 μm, na2=15.0 μm and na3=1.5 μm respectively is transferred to the wafer 175 in the manner described in (i), the relation between the size of the transferred pattern along the X-axis and the wafer position along the Z-axis is shown in FIG. 9. In this case, the wafer position at which the pattern comes into focus (the best focus position) is at 0 μm, and the deviation (the conversion differential) between the size along the X-axis when the wafer position is at −1.5 μm and the maximum value (in this case, the size along the X-axis when the wafer position is at 0 μm=31.0) is about 0.72 μm.

Figure 10:
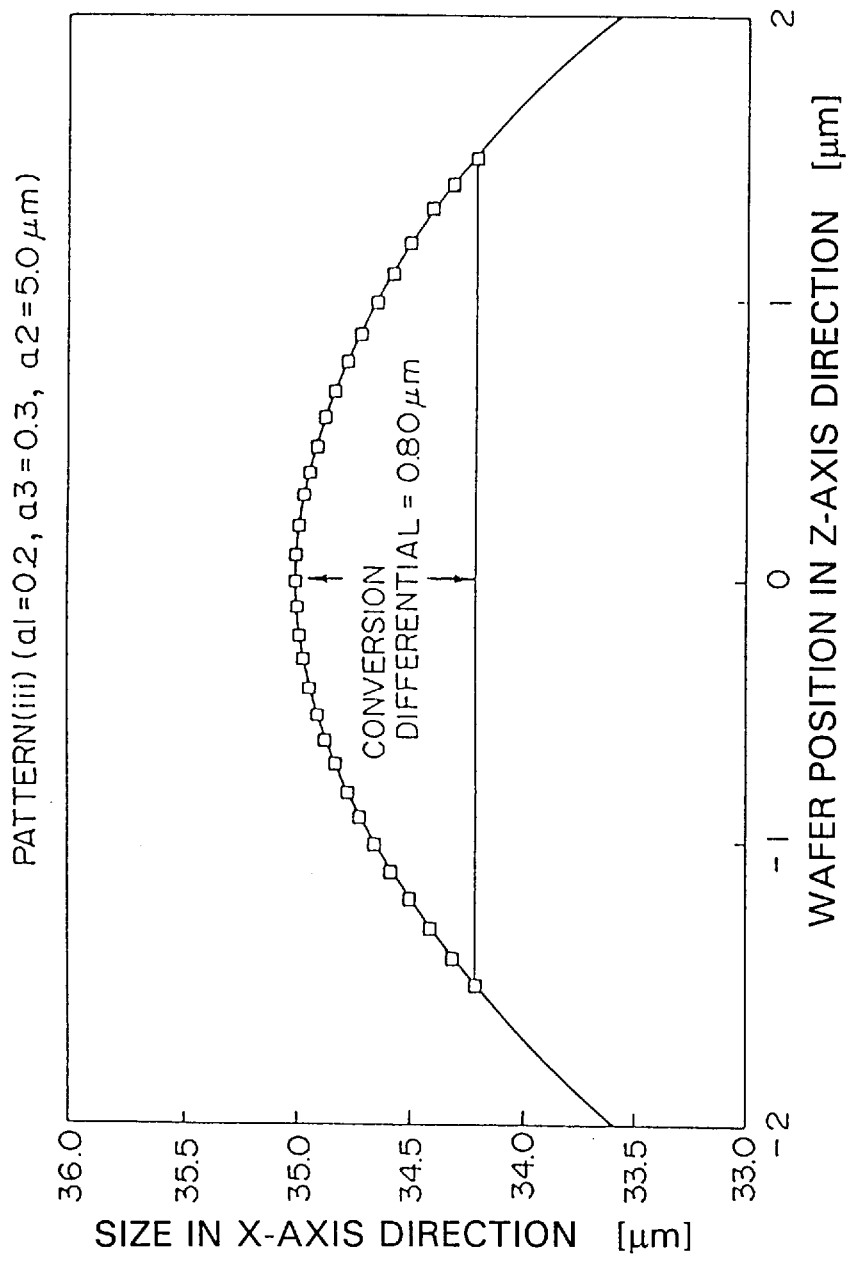
FIG. 10 is a diagram showing a relation between the size of the transferred pattern along the X-axis and the wafer position along the Z-axis when the third reticle pattern of FIGS. 7(a) and 7(b) is used, and wherein the projected dimensions a1, a2 a3 are 0.2 $\mu$m, 5.0 $\mu$m and 0.3 $\mu$m respectively.

(iii) If the reticle pattern shown in FIGS. 7(a) and 7(b), where na1=1.0 μm, na2=25.0 μm and na3=1.5 μm respectively is transferred to the wafer 175 in the manner described in (i), the relation between the size of the transferred pattern along the X-axis and the wafer position along the Z-axis is shown in FIG. 10. In this case, the wafer position at which the pattern comes into focus (the best focus position) is at 0 μm, and the deviation (the conversion differential) between the size along the X-axis when the wafer position is at −1.5 μm and the maximum value (in this case, the size along the X-axis when the wafer position is at 0 μm=35.0) is about 0.80 μm.

As shown in (i), (ii) and (iii), if na1 and na3 of the reticle pattern in FIG. 7(a) and 7(b) are 1.0 μm and 1.5 μm, respectively, a conversion differential of 0.7 to 0.8 μm is obtained not withstanding the length na2. This is 2.4 to 2.8 times the conversion differential (about 0.30 μm) when a reticle pattern having a width and pattern interval of about 0.5 μm is employed and measured by the SEM type size measuring equipment. Further, this is about 7 to 8 times the conversion differential (about 0.11 μm) in the case in which a reticle pattern having a width and pattern interval of about 1.5 μm is employed and measured by optical size measuring equipment.

Figure 11:
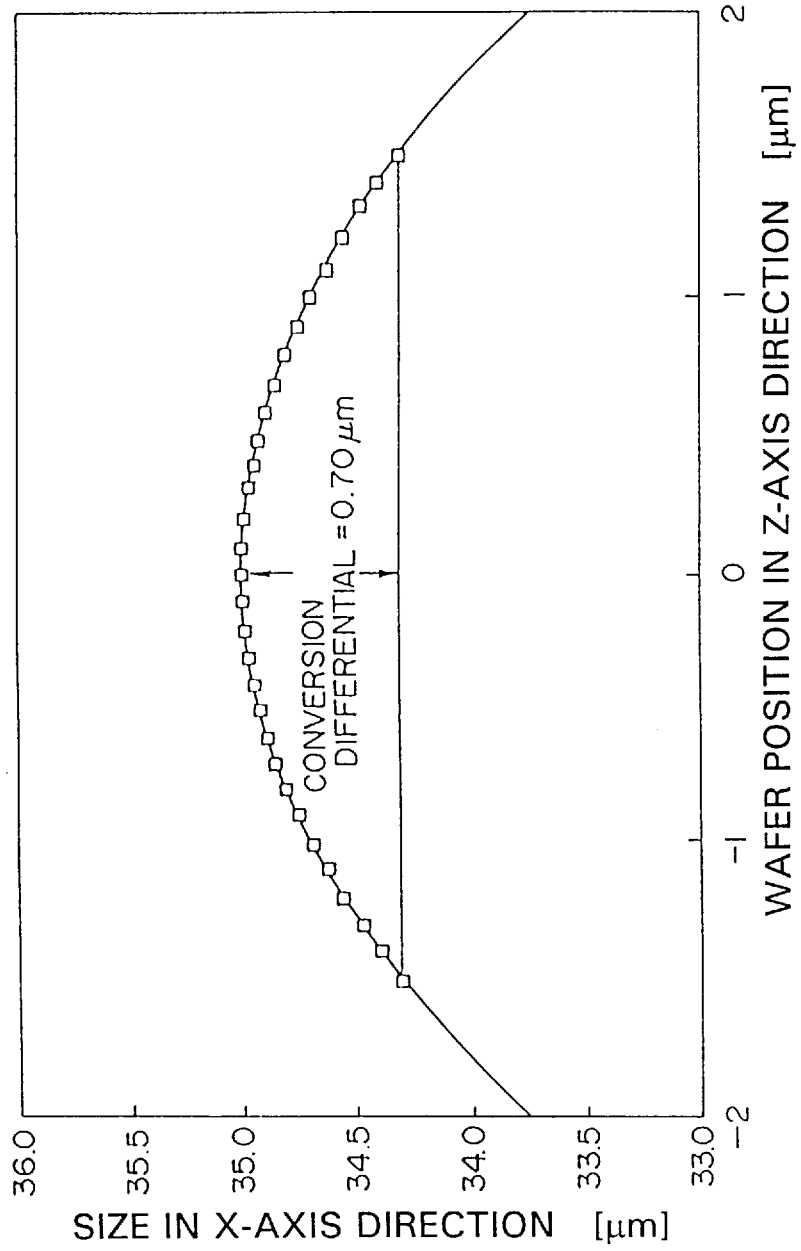
FIG. 11 is a diagram showing a relation between the size of the transferred pattern along the X-axis and the wafer position along the Z-axis when the third reticle pattern of FIGS. 7(a) and 7(b) is used, and wherein the projected dimensions a1, a2 and a3 are 0.1 $\mu$m, 5.0 $\mu$m and 0.2 $\mu$m respectively.

(iv) If the reticle pattern shown in FIGS. 7(a) and 7(b), where na1=0.5 μm, na2=25.0 μm and na3=1.0 μm respectively is transferred to the wafer 175 in the manner described in (i), the relation between the size of the transferred pattern along the X-axis and the wafer position along the Z-axis is shown in FIG. 11. In this case, the wafer position at which the pattern comes into focus (the best focus position) is at 0 μm, and the deviation (the conversion differential) between the size along the X-axis when the wafer position is at −1.5 μm and the maximum value (in this case, the size along the X-axis when the wafer position is at 0 μm=35.0) is about 0.70 μm. This numerical value is also a value seven times the conversion differential (about 0.1 μm) in the case that the reticle pattern with its pattern width and pattern interval of about 0.5 μm is employed.

Figure 12:
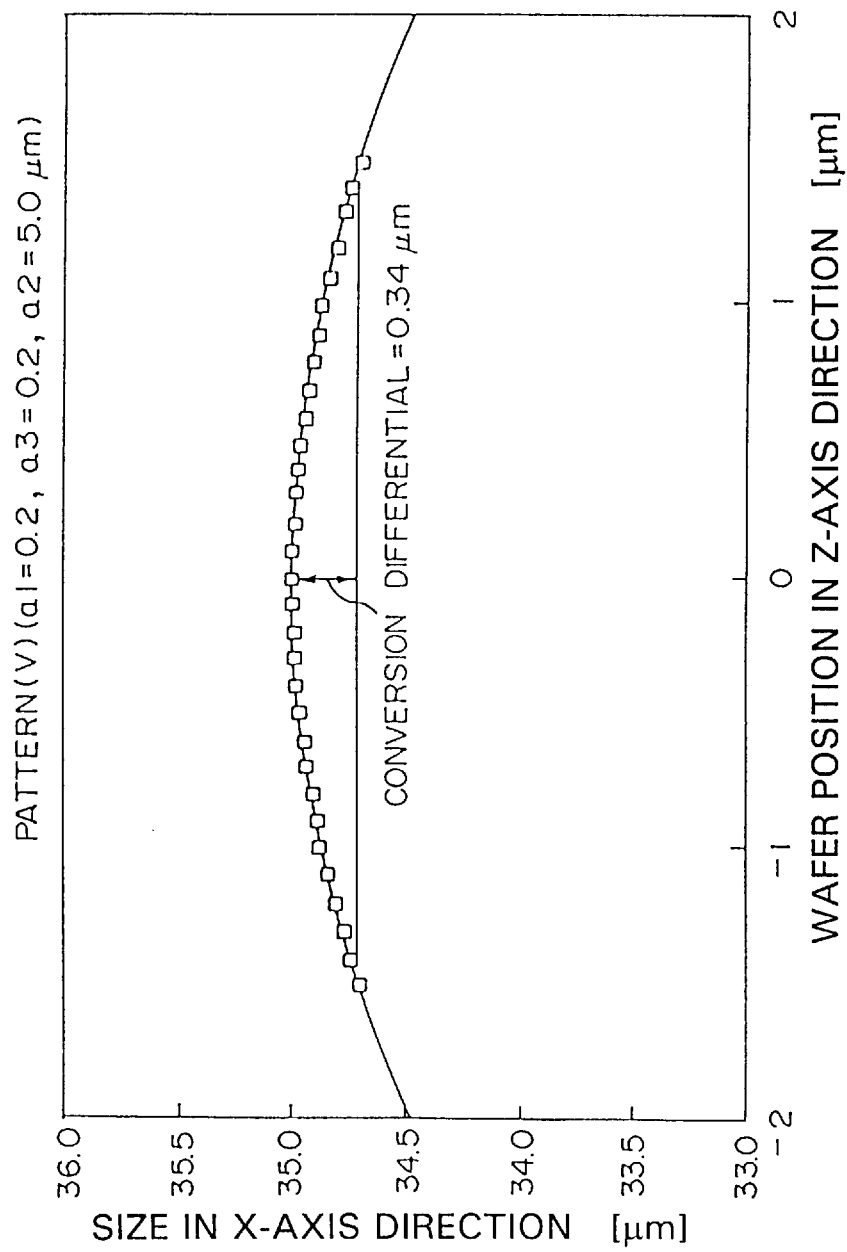
FIG. 12 is a diagram showing a relation between the size of the transferred pattern along the X-axis and the wafer position along the Z-axis when the third reticle pattern of FIGS. 7(a) and 7(b) is used, and wherein the projected dimensions a1, a2 and a3 are 0.2 $\mu$m, 5.0 $\mu$m and 0.2 $\mu$m respectively.

(v) If the reticle pattern shown in FIGS. 7(a) and 7(b), where na1=1.0 μm, na2=25.0 μm and na3=1.0 μm respectively is transferred to the wafer 175 in the manner described in (i), the relation between the size of the transferred pattern along the X-axis and the wafer position along the Z-axis is shown in FIG. 12. In this case, the wafer position at which the pattern comes into focus (the best focus position) is at 0 μm, and the deviation (the conversion differential) between the size along the X-axis when the wafer position is at −1.5 μm and the maximum value (in this case, the size along the X-axis when the wafer position is at 0 μm=35.0) is about 0.34 μm. This numerical value is 1.13 times the conversion differential (about 0.3 μm) in the case that the reticle pattern with its pattern width and pattern interval of about 0.5 μm is employed and measured by SEM type size measuring equipment, and is about 3 times the conversion differential (about 0.11 μm) in the case that the reticle pattern with its pattern width and pattern interval of about 1.5 μm is employed and measured by the optical size measuring equipment. However, the sensitivity is about one-half that resulting from the measurements made in tests (i) to (iv).

Figure 13:
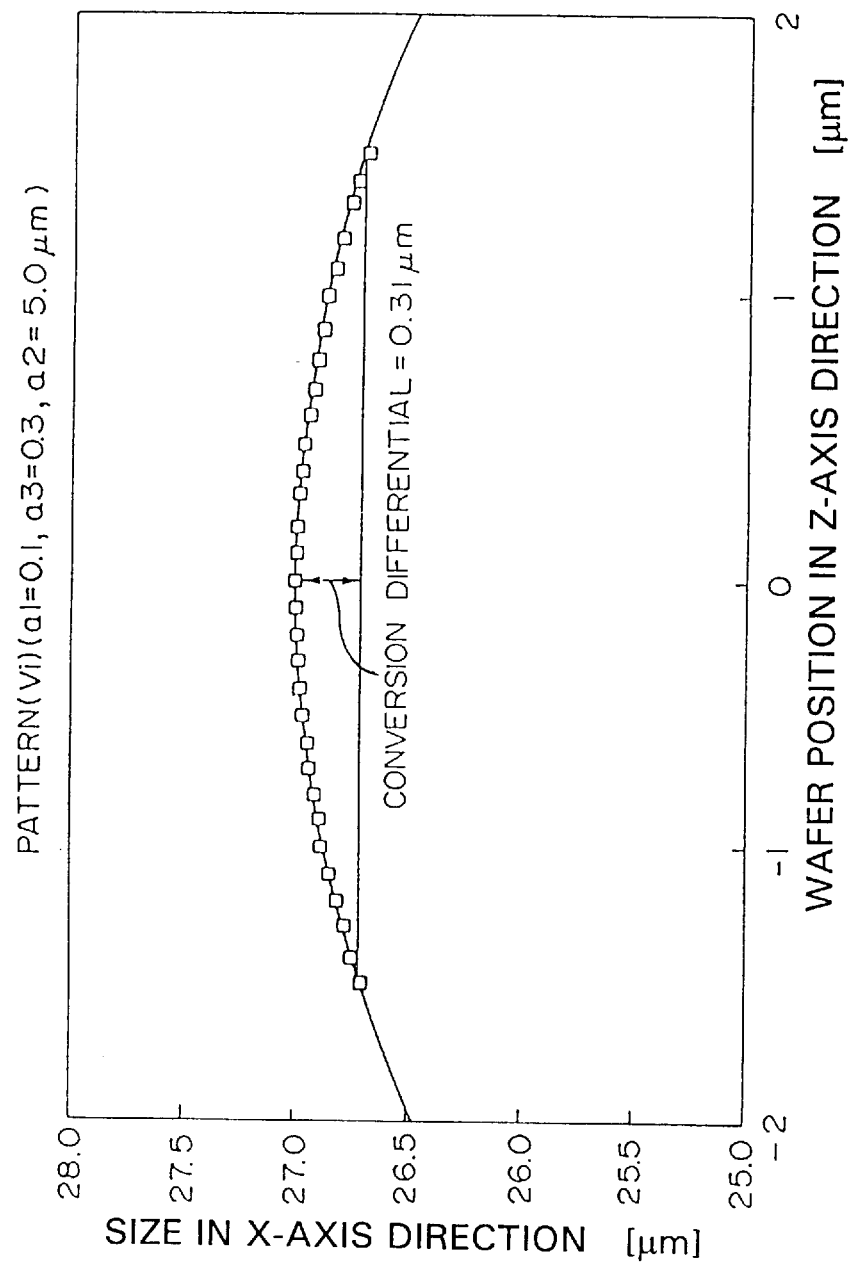
FIG. 13 is a diagram showing a relation between the size of the transferred pattern in the X-axis direction and the wafer position along the Z-axis when the third reticle pattern of FIGS. 7(a) and 7(b) is used, and wherein the projected dimensions a1, a2 and a3 are 0.1 $\mu$m, 5.0 $\mu$m and 0.3 $\mu$m respectively.

(vi) If the reticle pattern shown in FIGS. 7(a) and 7(b), where na1=0.5 μm, na2=25.0 μm and na3=1.5 μm respectively is transferred to the wafer 175, the relation between the size of the transferred pattern along the X-axis and the wafer position along the Z-axis is shown in FIG. 13. In this case, the wafer position at which the pattern comes into focus (the best focus position) is at 0 μm, and the deviation (the conversion differential) between the size along the X-axis when the wafer position is at −1.5 μm and the maximum value (in this case, the size along the X-axis when the wafer position is at 0 μm=27.0) is about 0.31 μm. This numerical value is 1.03 times the conversion differential (about 0.3 μm) in the case that the reticle pattern with its pattern width and pattern interval of about 0.5 μm is employed and measured by SEM type size measuring equipment, and is about 3 times the conversion differential (about 0.11 μm) in the case that the reticle pattern with its pattern width and pattern interval of about 1.5 μm is employed and measured by the optical size measuring equipment. However, the sensitivity is about half that resulting from the measurements made in tests (i) to (iv).

Table 1 shows data of the conversion differentials of (i) to (vi) above.

TABLE 1

[Unit: μm]

| Measuring Method | SEM | Optical | Optical | Optical | Optical | Optical | Optical | Optical |
|---|---|---|---|---|---|---|---|---|
| Pattern | Reticle Pattern | Reticle Pattern | (i) | (ii) | (iii) | (iv) | (v) | (vi) |
| Pattern Shape | Pattern Width & Interval = 0.5 | Pattern Width & Interval = 0.5 | a1 = 0.2 a3 = 0.3 a2 = 2.0 | a1 = 0.2 a3 = 0.3 a2 = 3.0 | a1 = 0.2 a3 = 0.3 a2 = 5.0 | a1 = 0.1 a3 = 0.2 a2 = 5.0 | a1 = 0.2 a3 = 0.2 a2 = 5.0 | a1 = 0.1 a3 = 0.3 a2 = 5.0 |
| Conversion Differential | 0.30 | 0.11 | 0.81 | 0.72 | 0.80 | 0.70 | 0.34 | 0.31 |
| Sensitivity Ratio | 1.00 | 0.36 | 2.70 | 2.40 | 2.67 | 2.33 | 1.13 | 1.03 |

Thus, when the reticle pattern for focus estimation in FIGS. 7(a) and 7(b) is used, a large conversion differential can be obtained for changes in the pattern size as the wafer position is changed along the Z-axis. Accordingly, the best focus position is easily determined, and patterns can be formed accurately by finely adjusting the wafer position from the determination of the best focus position.

Figure 15:
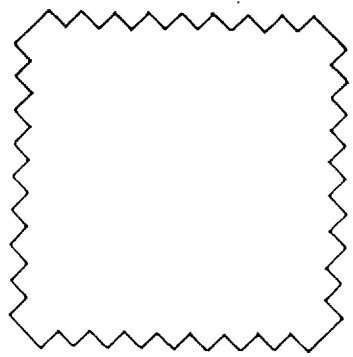
FIG. 15 is a diagram illustrating a fourth reticle pattern formed on a reticle for determining the optimum position of the surface of a semiconductor wafer onto which an image pattern is to be projected.
Figure 16:
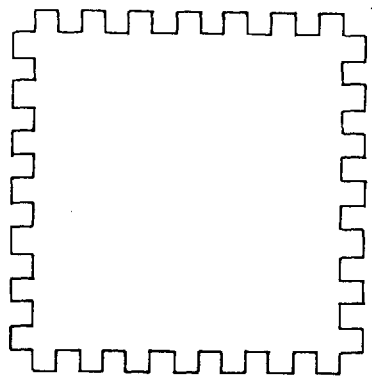
FIG. 16 is a diagram illustrating a fifth reticle pattern formed on a reticle for determining the optimum position of the surface of a semiconductor wafer onto which an image pattern is to be projected.

The following is a description of the third embodiment of the invention:

In some cases, changes in the shapes of the serrate portions shown in FIG. 5 and the comb tooth portions shown in FIG. 7 can be made. FIGS. 15 and 16 show examples of other shapes. FIG. 15 is an example in which the serrate portions are formed as isosceles triangles, and FIG. 16 is an example in which the comb-tooth portion is in the shape of a square.

Although such serrate portions and comb tooth portions are effective if formed only along either the X or Y axes, the focus estimation along the X and Y-axes can be made simultaneously from the same pattern if they are formed at the entire periphery of the pattern.

Industrial Applicability

According to a first embodiment of the invention, a first image pattern is deposited on a reticle 173 and, when illumination is provided by a light source 171 positioned above the reticle, projected on a wafer 175 below the reticle with a resolvable line width. A second or reticle pattern, formed adjacent to the first pattern, has very fine lines and spaces characterized by a non-resolvable line width and/or non-resolvable spaces between the lines. The second pattern, when used, provides a large conversion differential with changes in the wafer position.

According to a second embodiment of the invention, the best focus position can be easily determined because, during the process for transferring the reticle pattern for focus estimation of the first embodiment of the invention onto the wafer, the pattern is transferred multiple times at varying distance between the pattern for focus estimation and the set position of the wafer. The distance from the end of the first transferred portion corresponds to the first pattern portion to the end of the second transferred portion corresponding to the second pattern portion, of the respective transferred patterns which are transferred onto the wafer by the multiple time transfers, is measured. The set position of the wafer at which the pattern comes into focus is determined from the measurement results.

Accordingly, from this determination of the best focus position, the patterns can be accurately formed by finely adjusting the wafer position.

I claim:

1. In combination with an apparatus for manufacturing a semiconductor device, said apparatus having a radiation source, means for supporting a semiconductor wafer, and a reticle interposed between said radiation source and said wafer, a method of determining the optimum position of said wafer with respect to a focal point thereof, comprising the steps of:

forming a reticle pattern on said reticle, said reticle pattern having a plurality of elements each separated from adjacent elements by a distance which is not greater than a resolution limit;

changing in successive increments and/or decrements the distance between the wafer and the reticle;

projecting radiation from said radiation source through said reticle pattern to form transferred reticle patterns on the wafer at each of said incremental and/or decremental distances, each of said transferred reticle patterns having first and second spaced end portions;

measuring the spacing between the first and second end portions of said transferred reticle patterns at each of said distances;

selecting one of said measured distances; and setting the wafer at the position corresponding to the selected distance.

2. The method defined by claim 1 wherein said reticle pattern comprises a plurality of spaced parallel lines of equal width.

3. The method defined by claim 2 wherein the spacing between each of said lines is equal to the width of said lines.

4. The method defined by claim 1 wherein an image pattern is also formed on said reticle, said image pattern when projected on said wafer forming a projected image pattern on said wafer which is resolvable, the resolution of said projected image pattern being greater than the resolution limit of said apparatus.

5. The method defined by claim 4 wherein said reticle pattern comprises a plurality of spaced parallel lines of equal width, the spacing between each of said lines being equal to the width thereof.

6. The method defined by claim 1 wherein said reticle pattern comprises a rectangular area having parallel spaced sides, opposite spaced sides of said rectangular area having triangular serrate portions wherein each of said triangular portions has a base which is twice the height thereof.

7. The method defined by claim 1 wherein said reticle pattern comprises a rectangular area having parallel spaced sides, each of the sides of said rectangular area having plural rectangular comb-tooth shaped portions wherein alternate first elements of said comb-tooth shaped portions have a first width, and second elements thereof located between each of said first elements have a second width, said second width being greater than said first width.

8. In combination with an apparatus for manufacturing a semiconductor device, said apparatus having a radiation source, means for supporting a wafer, and a reticle interposed between said radiation source and said wafer, a method of determining the optimum position of said wafer with respect to a focal point thereof, comprising the steps of:

forming a reticle pattern on said reticle, said reticle pattern having a plurality of serrate portions at an end thereof, each of said serrate portions being separated from each other at a distance which is not greater than a resolution limit;

changing in successive increments and/or decrements the distance between the wafer and the reticle;

projecting radiation from said radiation source through said reticle pattern to form transferred reticle patterns on the wafer at each of said incremental and/or decremental distances, each of said transferred reticle patterns having first and second spaced end portions;

measuring the spacing between the first and second end portions of said transferred reticle patterns at each of said distances;

selecting one of said measured distances; and setting the wafer at the position corresponding to the selected distance.

9. The method defined by claim 8 wherein an image pattern is also formed on said reticle, said image pattern when projected on said wafer forming a projected image pattern on said wafer which is resolvable, the resolution of said projected image pattern being greater than the resolution limit of said apparatus.

10. A method of determining the optimum position of a wafer comprising the steps of forming a reticle pattern on a reticle having a plurality of elements, each of said elements being separated from adjacent elements by a distance which is not greater than a resolution limit;

changing in successive increments and/or decrements the distance between the wafer and said reticle;

projecting radiation from a radiation source through said reticle pattern to form transferred reticle patterns having spaced end portions on the wafer at each of the incremental and/or decremental distances;

measuring the spacing between said end portions of said transferred reticle patterns at each of said distances;

selecting one of said measured distances; and setting the wafer at the position corresponding to the selected distance.

11. The method defined by claim 10 wherein an image pattern is also formed on said reticle, said image pattern when projected on said wafer forming a projected image pattern on said wafer which is resolvable, the resolution of said projected image pattern being greater than the resolution limit of said apparatus.

* * * * *